United States Patent
Guo

(10) Patent No.: US 10,783,943 B2
(45) Date of Patent: Sep. 22, 2020

(54) MRAM HAVING NOVEL SELF-REFERENCED READ METHOD

(71) Applicant: Yimin Guo, San Jose, CA (US)

(72) Inventor: Yimin Guo, San Jose, CA (US)

(*) Notice: Subject to any disclaimer, the term of this patent is extended or adjusted under 35 U.S.C. 154(b) by 35 days.

(21) Appl. No.: 14/181,880

(22) Filed: Feb. 17, 2014

(65) Prior Publication Data

US 2014/0301135 A1 Oct. 9, 2014

Related U.S. Application Data

(60) Provisional application No. 61/766,617, filed on Feb. 19, 2013.

(51) Int. Cl.
  *G11C 11/00* (2006.01)
  *G11C 11/16* (2006.01)
  *H01L 43/08* (2006.01)
  *H01L 43/10* (2006.01)

(52) U.S. Cl.
  CPC ............ *G11C 11/161* (2013.01); *H01L 43/08* (2013.01); *H01L 43/10* (2013.01)

(58) Field of Classification Search
  CPC ........ G11C 11/161; H01L 43/08; H01L 43/10
  USPC ....................................................... 365/158
  See application file for complete search history.

(56) References Cited

U.S. PATENT DOCUMENTS

| | | | |
|---|---|---|---|
| 8,817,425 B1* | 8/2014 | Wu | G11B 5/3133 360/125.32 |
| 2008/0266943 A1* | 10/2008 | Yang | G11C 11/16 365/171 |
| 2010/0244897 A1* | 9/2010 | Saito | G11C 11/16 326/49 |
| 2011/0228596 A1* | 9/2011 | Inokuchi | G11C 11/16 365/158 |
| 2011/0303996 A1* | 12/2011 | Kim | B82Y 25/00 257/421 |
| 2012/0063034 A1* | 3/2012 | Hsu | B82Y 10/00 360/319 |
| 2012/0261777 A1* | 10/2012 | Shukh | H01L 43/08 257/421 |
| 2013/0248941 A1* | 9/2013 | Inokuchi | H01L 29/66984 257/252 |
| 2013/0249028 A1* | 9/2013 | Kamata | H01L 43/08 257/427 |
| 2014/0198564 A1* | 7/2014 | Guo | G11C 11/1673 365/158 |
| 2014/0295579 A1* | 10/2014 | Guo | H01L 43/08 438/3 |

(Continued)

*Primary Examiner* — Huan Hoang

(57) ABSTRACT

A STT-MRAM comprises apparatus, a method of operating and a method of manufacturing a self-referenced magnetoresistive memory and a plurality of magnetoresistive memory element including a self-referenced read scheme through a write/read circuitry coupled to the bit line positioned adjacent to selected ones of the plurality of magnetoresistive memory elements to supply bi-directional spin-transfer recording and reading currents across the MTJ stack. Thus magnetization of a recording layer can be readily switched or reversed to the direction in accordance with a direction of a current across the MTJ stack by applying a spin transfer current, and the magnetization of a reference layer can be readily rotated to two reading directions subsequently in accordance with directions of currents across the MTJ stack by applying low spin transfer currents.

20 Claims, 6 Drawing Sheets

(56) References Cited

U.S. PATENT DOCUMENTS

| | | | | |
|---|---|---|---|---|
| 2014/0353662 A1* | 12/2014 | Shukh | ............... | H01L 27/2436 257/43 |
| 2015/0069544 A1* | 3/2015 | Nagamine | ............... | H01L 43/08 257/421 |
| 2015/0249096 A1* | 9/2015 | Lupino | ............. | H01L 27/11898 257/203 |
| 2015/0255712 A1* | 9/2015 | Tsubata | ................... | H01L 43/12 257/295 |

* cited by examiner

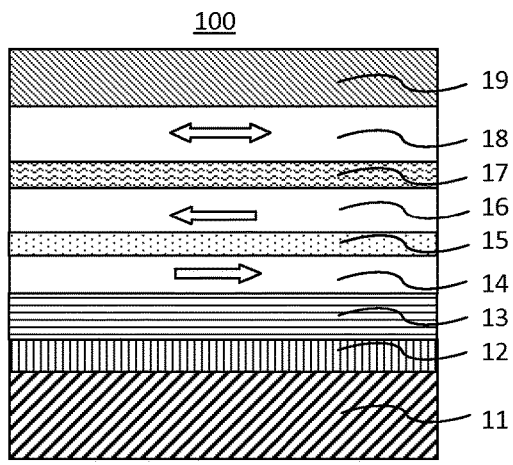
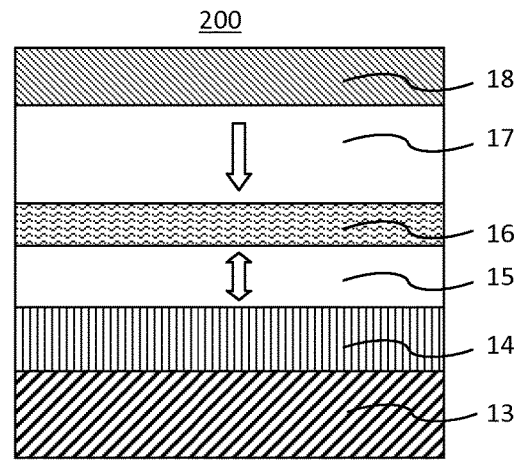
Figure 1(A)
Figure 1(B)
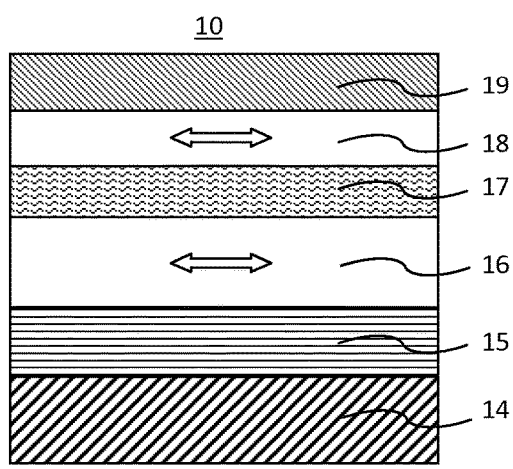
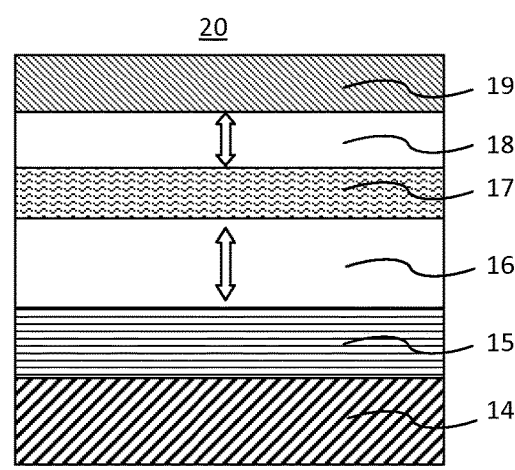
Figure 2(A)
Figure 2(B)

MRAM HAVING NOVEL SELF-REFERENCED READ METHOD

RELATED APPLICATIONS

This application claims the priority benefit of U.S. Provisional Application No. 61,766,617, filed on Feb. 19, 2013, which is incorporated herein by reference

BACKGROUND OF THE INVENTION

1. Field of the Invention

This invention relates generally to a spin-transfer-torque magnetic-random-access memory (MRAM) element, more particularly to structures and methods of novel self-referenced reading and programming a spin-torque magnetoresistive random access memory (MRAM) element having a soft reference layer.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can also cope with high-speed reading and writing. A typical ferromagnetic tunnel junction has a three-layer stack structure formed by stacking a recording layer having a changeable magnetization direction, an insulating tunnel barrier layer, and a fixed reference layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device. The value change of this resistance could reach the order of a few hundred percent as long as a coherent magnetic tunneling effect is enabled by utilizing tunnel barrier materials, such as MgO. Therefore, for a low resistance value of 10K ohms, the high resistance value could be about 20 to 30K ohms. A sense amplifier for an MRAM needs to detect this difference in value. Normally, a read circuitry is configured to detect the state of a bit by comparing the resistance of the tunnel junction in a bit to a nearby midpoint reference (the averages of the maximum and minimum resistances) that may be formed as a midpoint of a reference bit in the high resistance state and a reference bit in the low resistance state. It is also important to maintain symmetry to balance the loading from the parasitic resistance and capacitance of the bit lines and the column multiplexing. A more robust reading scheme consists of two MTJ cells per bit, in which two separate MTJ cells are written into opposite resistance states and their resistance states are compared and detected through a sense amplifier.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller. Further, in a so-called perpendicular STT-MRAM, both two magnetization films in an MTJ stack have easy axis of magnetization in a direction perpendicular to the film plane due to their strong magnetic crystalline anisotropy and interface interaction induced anisotropy, shape anisotropies are not used, and accordingly, the device shape can be made smaller than that of an in-plane magnetization type. Also, variance in the easy axis of magnetization can be made smaller. Accordingly, both miniaturization and lower currents can be expected to be achieved while a thermal disturbance resistance is maintained. In another word, perpendicular STT-MRAM having high speed, large capacities and low-power-consumption operations can potentially replace the conventional semiconductor memory used in electronic chips, especially mobile chips for power saving and non-volatility.

In the mean time, since the switching current requirements reduce with decreasing MTJ element dimensions, STT-MRAM has the potential to scale nicely at even the most advanced technology nodes. A traditional reading scheme in an MRAM involves applying a voltage to a selected MTJ stack and its reference MTJ stack to discover whether the MTJ element states at high resistance or low. However, patterning of ultra-small dimension MTJ elements leads to increasing variability in MTJ resistance, and read detection error-free margin is reduced as the memory capacity is very large. One approach to manage the increasing MTJ resistance variability is to use a self-referenced read scheme to determine the state of the bits. In a prior art of such self-referenced read scheme, a preset read voltage is applied to a selected bit and a reference reflecting the required current is read and maintained, then a larger switch current is applied to write the bit to a known state. The original state of the bit can be determined by comparing the read current in the known state to the current that was required in the original state. No change in current would indicate that the original state matched the known state, while a change in current in the expected direction would indicate that the original state was opposite of the known state, and an additional writing is required to switch the bit back to the original state.

Although a self reference read scheme can overcome the impact of MTJ resistance variation, it also leads to a longer time and higher power consumption during a read operation. Thus, it is desirable to provide STT-MRAM structures and methods that shorten a self-referenced read operation, reduce the power requirement when performing a self-referenced read operation.

BRIEF SUMMARY OF THE PRESENT INVENTION

The present invention comprises a magnetoresistive memory cell having a ferromagnetic tunnel junction stack structure formed by stacking a recording layer having a switchable magnetization direction, an insulating tunnel barrier layer, a soft reference layer having a variable magnetization direction that is located on the opposite side from the recording layer. Data is recorded or written in the recording layer magnetization direction through a spin transfer torque induced switching or reversing to the direction in accordance with a direction of a current across the magnetoresistive stack by applying a spin-polarized current. A reading process is conducted through a self-referenced read operation, in which the reference layer is set along a first magnetization direction and a preset read voltage is applied to a selected bit and a first reference reflecting the required current is read and maintained, then the reference layer is set along a second magnetization direction and a preset read voltage is applied to a selected bit and a second reference reflecting the required current is read. The state of the bit can be determined by comparing the two reference currents through a sense amplifier. A bit state is determined to be a first state as the first reference is higher than the second reference; while the bit state is determined to be a second state as the first reference is lower than the second reference.

An exemplary embodiment includes an additional fixed spin layer, a nonmagnetic spacing layer and a ferromagnetic tunnel junction stack structure located on the opposite side from the fixed spin layer and formed by stacking a recording layer having a switchable magnetization direction, an insulating tunnel barrier layer, a soft reference layer having a variable magnetization direction that is located on the opposite side from the recording layer. It also includes a method of operating a spin-transfer-torque magnetoresistive memory including a circuitry coupled to the bit line positioned adjacent to selected ones of the plurality of magnetoresistive memory elements to supply a reading current or bi-directional spin-transfer recording current, and coupled to the digital line configured to set the reference layer magnetization along the first and second directions sequentially during a reading process.

Another exemplary embodiment includes a magnetic domain wall driver and a ferromagnetic tunnel junction stack structure located along the domain wall driver and formed by stacking a recording layer having a switchable magnetization direction, an insulating tunnel barrier layer, a soft reference layer having a variable magnetization direction that is located on the opposite side from the recording layer. It also includes a method of operating a spin-transfer-torque domain wall magnetoresistive memory including a circuitry coupled to the domain wall driver positioned connected to the recording layer of a selected MTJ element of the plurality of magnetoresistive memory elements to supply a bi-directional spin-transfer recording current to drive magnetic domain wall moving, and coupled to the bit line positioned adjacent to selected ones of the plurality of magnetoresistive memory elements to supply a reading current, coupled to the digital line configured to set the reference layer magnetization along the first and second directions sequentially during a reading process.

Various embodiments will be described hereinafter with reference to the companying drawings. The drawings are schematic or conceptual, and the relationships between the thickness and width of portions, the proportional coefficients of sizes among portions, etc., are not necessarily the same as the actual values thereof.

BRIEF DESCRIPTION OF THE DRAWINGS

FIG. 1(A) is a schematic cross-section view of one memory cell in a planar STT-MRAM array in a prior art;
FIG. 1(B) is a schematic cross-section view of one memory cell in a perpendicular STT-MRAM array in a prior art;
FIG. 2(A) is a schematic cross-section view of one memory cell in a planar STT-MRAM array according to the first embodiment;
FIG. 2(B) is a schematic cross-section view of one memory cell in a perpendicular STT-MRAM array according to the second embodiment.

DETAILED DESCRIPTION OF THE INVENTION

Figure 3A:
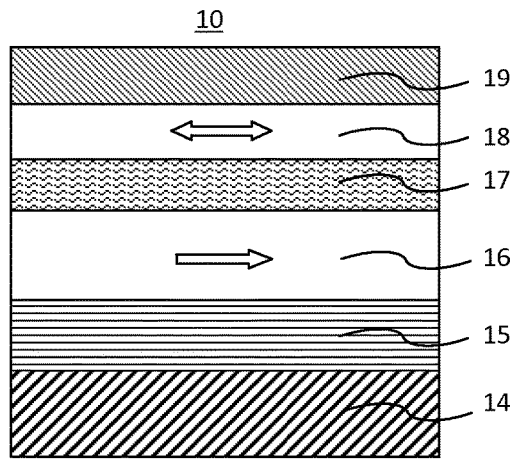
FIG. 3(A) illustrates a memory element, according to the first embodiment, having a bit "0" written in the recording layer.

In general, according to each embodiment, there is provided a magnetoresistive memory cell stack comprising:
a recording layer having a magnetic anisotropy and having a switchable magnetization along one of the two opposite anisotropy easy axis directions;
a tunnel barrier layer on a surface of the recording layer;
a soft reference layer on a surface of the tunnel barrier layer and located on the opposite side from the recording layer, and having a variable magnetization direction;
an optional spin-reading multilayer on a surface of the reference layer and located on the opposite side from the tunnel barrier layer, and consisting of a nonmagnetic spacing layer and a ferromagnetic or ferrimagnetic layer having a fixed magnetization direction;
an optional spin-recording multilayer on a surface of the recording layer and located on the opposite side from the tunnel barrier layer, and consisting of a nonmagnetic spacing layer and a ferromagnetic or ferrimagnetic layer having a fixed magnetization direction.

Further, the magnetoresistive memory cell stack is sandwiched by an upper electrode and a bottom electrode; a bit line provided on the top surface of the upper electrode; a select CMOS transistor coupled the plurality of magnetoresistive memory elements through the bottom electrode.

A data bit is written or recorded in the recording layer as its magnetization in either of the two easy axis directions by means of spin transfer torque induced switching from the spin-recording layer, or domain wall moving, etc.

The stored data is read through measuring and comparing the two resistances as the magnetization in the soft reference layer is rotated to be along one and the other easy axis direction of the recording layer magnetization anisotropy, by means of external magnetic field, or spin transfer torque from the spin-reading multilayer.

An exemplary embodiment includes configuration and method of operating a spin-transfer-torque magnetoresistive memory including a self-referenced read scheme through a write/read circuitry coupled to the bit line positioned adjacent to selected ones of the plurality of magnetoresistive memory elements to supply bi-directional spin-transfer recording and reading currents across the MTJ stack. Thus magnetization of a recording layer can be readily switched or reversed to the direction in accordance with a direction of a current across the MTJ stack by applying a spin transfer current, and the magnetization of a reference layer can be readily rotated to two reading directions subsequently in accordance with directions of currents across the MTJ stack by applying low spin transfer currents.

Another exemplary embodiment includes configuration and method of operating a domain wall magnetoresistive memory including a domain wall recording scheme through a write circuitry coupled to a recording layer to supply bi-directional in-plane recording currents along the recording layer and a self-referenced read scheme through a read circuitry coupled to the bit line positioned adjacent to selected ones of the plurality of magnetoresistive memory elements to supply bi-directional spin-transfer reading currents across the MTJ stack. Thus magnetization domain of a recording layer can be readily moved to the direction in accordance with a direction of a current across the MTJ stack by applying a spin transfer current, and the magnetization of a reference layer can be readily rotated to two reading directions subsequently in accordance with directions of currents across the MTJ stack by applying low spin transfer currents.

Another exemplary embodiment includes configuration and method of operating a spin-transfer-torque magnetoresistive memory including a voltage-gated recording scheme through a write circuitry coupled to the bit line positioned adjacent to selected ones of the plurality of magnetoresistive memory elements to supply bi-directional spin-transfer recording currents across the MTJ stack and coupled to the digital line configured to generate an electric field perpendicular to the top surface of a functional layer, manipulating the perpendicular anisotropy strength and reducing the magnetization switching energy barrier of a recording layer, and a self-referenced read scheme through a read circuitry coupled to the bit line positioned adjacent to selected ones of the plurality of magnetoresistive memory elements to supply bi-directional spin-transfer reading currents across the MTJ stack. Thus magnetization of a recording layer can be readily switched or reversed to the direction in accordance with a direction of a current across the MTJ stack by applying a spin transfer current, and the magnetization of a reference layer can be readily rotated to two reading directions subsequently in accordance with directions of currents across the MTJ stack by applying low spin transfer currents.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

FIG. 1(A) is a cross-sectional view of a magnetoresistive memory cell 100 in a planar STT-MRAM array as a first prior art. The magnetoresistive memory cell 100 is configured by a bottom electrode 11, a seed layer 12, an antiferromagnetic layer 13, a pinned layer 14, an anti-parallel spacing layer 15, a reference layer 16, a tunnel barrier layer 17, a recording layer 18 and an upper electrode 19. The magnetization direction in the reference layer is fixed through an anti-parallel coupling with the pinned layer which is further pinned by the antiferromagnetic layer.

FIG. 1(B) is a cross-sectional view of a magnetoresistive memory cell 200 in a perpendicular STT-MRAM array as a second prior art. The magnetoresistive memory cell 100 is configured by a bottom electrode 13, a seed layer 14, a recording layer 15, a tunnel barrier layer 16, a reference layer 17 and an upper electrode 18. The magnetization direction in the reference layer is fixed through a very strong perpendicular anisotropy by material selection which typically is CoFeB/TbCoFe, or CoFeB/(Co/Pt)n, etc., and a very high damping constant which prohibits spin transfer induced switching.

FIG. 2(A) is a cross-sectional view of a memory element 10, according to the first embodiment. The in-plane magnetoresistive element 10 comprises: a bottom electrode 14, a spin-recording multilayer 15, a recording layer 16, a tunnel barrier layer 17, a reference layer 18 and an upper electrode 19. The recording layer typically has a magnetic easy axis defined by the combination of an oval-like shape of the recording layer in the film plane and a crystalline anisotropy, so that the recording layer has two stable magnetic states with magnetization directions along the easy axis. The energy barrier between the two stable states is high enough to ensure good data retention, and a large enough spin transfer current flowing across the recording layer and the adjacent spin-recoding layer can switch the magnetization of the recording layer form one stable state to the other stable state. The recording layer and the reference layer are made of ferromagnetic materials so that the spin transfer efficiency between them is reduced while the magnetoresistive ratio is maintained at a high value. Unlike a fixed magnetization in prior arts, the reference layer has a small coercive force or a small anisotropy in the film plane. Utilizing an external magnetic field generated from an adjacent current flow or a spin transfer torque, the magnetization in the reference layer is easily set along the two opposite directions predominately parallel or anti-parallel to the recording layer easy axis.

FIG. 2(B) illustrates a memory element, according to the second embodiment, having a perpendicular magnetoresistive element. The perpendicular magnetoresistive element 20 comprises: a bottom electrode 14, a spin-recording layer 15, a recording layer 16, a tunnel barrier layer 17, a reference layer 18 and an upper electrode 19. The recording layer 16 has a perpendicular anisotropy, or its magnetic easy axis is perpendicular to the film plane and the recording layer has two stable magnetic states with magnetization directions along the easy axis. The energy barrier between the two stable states is high enough to ensure a good data retention. The recording layer and the reference layer are made of ferromagnetic materials so that the spin transfer efficiency between them is reduced while the magnetoresistive ratio is maintained at a high value. Unlike an un-switchable magnetization in prior arts, the reference layer has a small perpendicular anisotropy. Utilizing a spin transfer torque effect, the magnetization in the reference layer is easily set along the two opposite directions predominately parallel or anti-parallel to the recording layer easy axis subsequently to read out the magnetization state in recording layer.

Figure 3B:
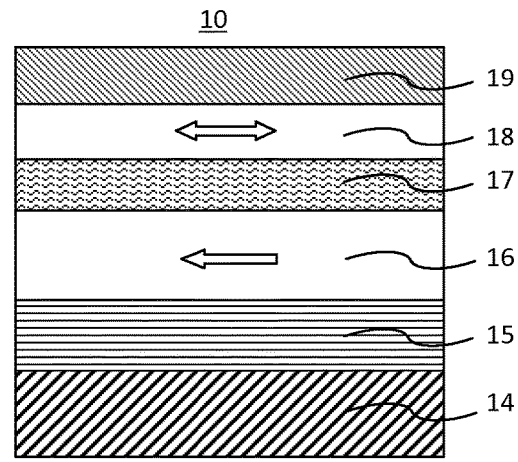
FIG. 3(B) illustrates a memory element, according to the first embodiment, having a bit "1" written in the recording layer.
Figure 4A:
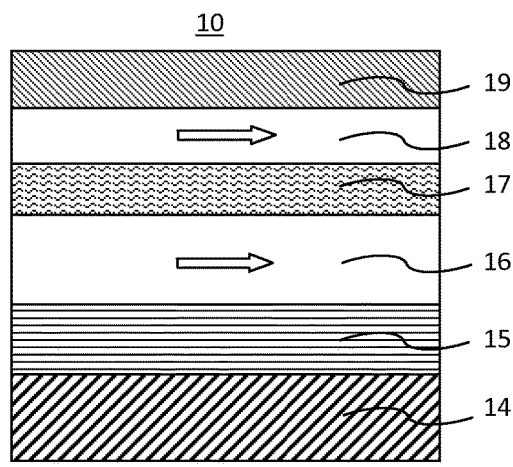
FIG. 4(A) illustrates a memory element, according to the first embodiment, having a bit "0" written in the recording layer, and having the magnetization direction in the reference layer set along +x direction to read the resistance of the magnetization state.
Figure 4B:
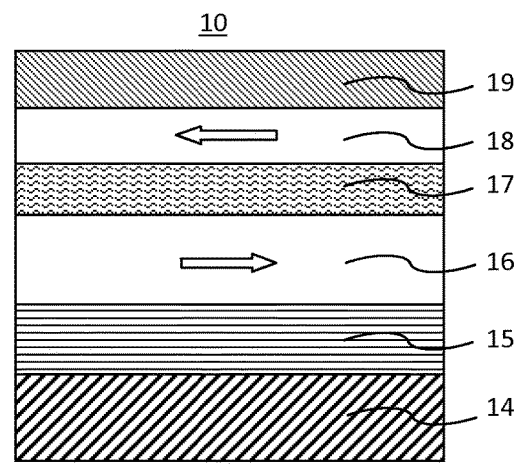
FIG. 4(B) illustrates a memory element, according to the first embodiment, having a bit "0" written in the recording layer, and having the magnetization direction in the reference layer set along −x direction to read the resistance of the opposite magnetization state.

FIGS. 3(A, B) show magnetoresistive element 20 illustrating the magnetization states of a recording layer in a spin-transfer-torque magnetoresistive memory, respectively, according the first embodiments. In each state, the magnetization direction of the recording layer aligns along easy axis, as stored data bits. FIGS. 4(A, B) show a self-referenced read scheme, in which the magnetization in the reference layer is first set along +x direction, as shown in FIG. 3A, which is predominately parallel to the easy axis of the recording layer by mean of an external field or spin transfer current from an adjacent optional spin layer, which is not shown here, and the first resistance is read by a circuitry, which is not shown here, is coupled to the bit line for providing a reading current between the bit line and the bottom electrode connecting to the select transistor. Then the magnetization in the reference layer is first set along +x direction, as shown in FIG. 3B, and the second resistance is read our again and compared to the first resistance. The difference between the first and second is used to determine the magnetic state in the recording layer: a positive difference indicates a data bit "1" and a negative difference indicates a data bit "0".

Figure 5:
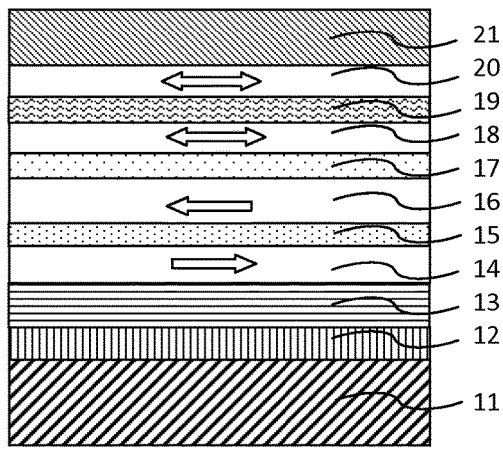
FIG. 5 is a schematic cross-sectional view of a memory element, according to a modification of the first embodiment.

FIG. 5 is a cross-sectional view of a memory element 10, according to a modification of the first embodiment. The in-plane magnetoresistive element 10 comprises: a bottom electrode 11, a seed layer 12, an antiferromagnetic layer 13, a pinned layer 14, an anti-parallel coupling spacing layer 15, a fixed magnetic layer 16, a nonmagnetic spacing layer 17, a reference layer 18, a tunnel barrier layer 18, a recording layer 20 and an upper electrode 21. Here, the stack from the layer 13 to the layer 17 forms a spin-recording multilayer. The soft reference layer is made of material which has much lower magnetic anisotropy than the recording layer; accordingly, a small reading current can set or switch the magnetization of the soft reference layer with a spin transfer torque effect while the magnetization of the recording layer is stable against the reading spin current. Further, after writing or reading operation, the magnetization of the soft reference layer may rotate to a direction anti-parallel to the magnetization direction of the recording layer, forming a flux-closure between the soft reference layer and the recording layer. Thus, the stored data is more stable than a single recording layer due to the flux closure, and the stray magnetic field and adjacent interference are reduced.

Figure 6:
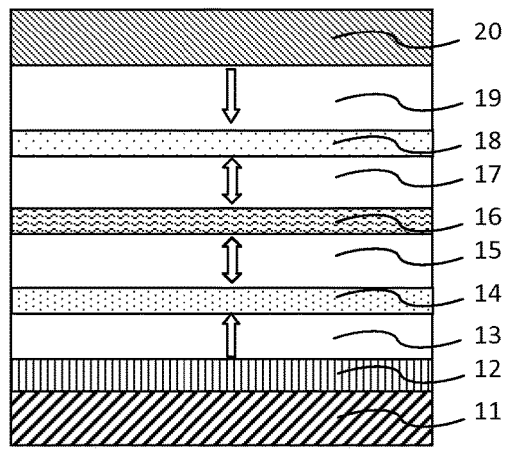
FIG. 6 is a schematic cross-sectional view of a memory element, according to a modification of the second embodiment.

FIG. 6 is a cross-sectional view of a memory element 20, according to a modification of the first embodiment. The perpendicular magnetoresistive element 20 comprises: a bottom electrode 11, a seed layer 12, a first spin layer 13, a first nonmagnetic spacing layer 14, a reference layer 15, a tunnel barrier layer 16, a recording layer 17, a second nonmagnetic spacing layer 18, a second spin layer 19 and an upper electrode 20. Here, a spin-recording multilayer consists of the layer 13 and the layer 14; while a spin-reference multilayer consists of the layer 18 and the layer 19.

Figure 7:
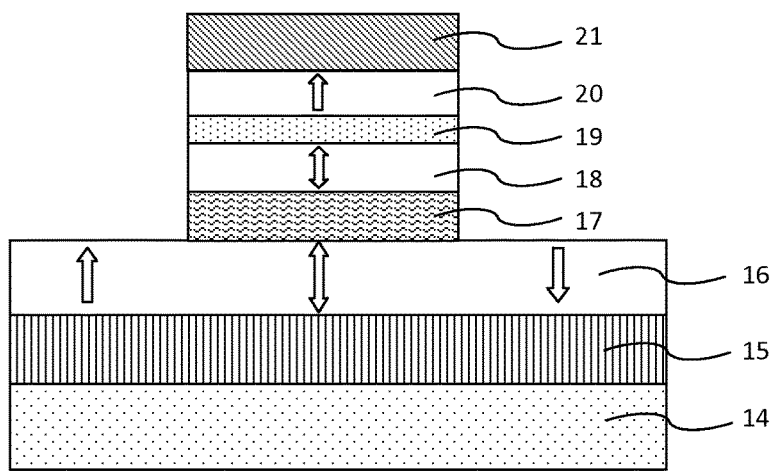
FIG. 7 is a schematic cross-sectional view of a memory element, according to the third embodiment.

FIG. 7 illustrates a memory element, according to the third embodiment, having a domain wall motion recording scheme. The perpendicular magnetoresistive element 30 comprises: a dielectric substrate 14, a seed layer 15, a perpendicular recording layer 16, a tunnel barrier layer 17, a reference layer 18, a nonmagnetic spacing layer 19, a fixed spin layer 20 and an upper electrode 21. Here, a spin-reference multilayer consists of the layer 19 and the layer 20. The recording layer has a vertical domain wall structure having opposite fixed magnetization directions in the two side regions which are not overlaid by the reference layer and switchable magnetization direction in the region which is overlaid by the reference layer.

Figure 8A:
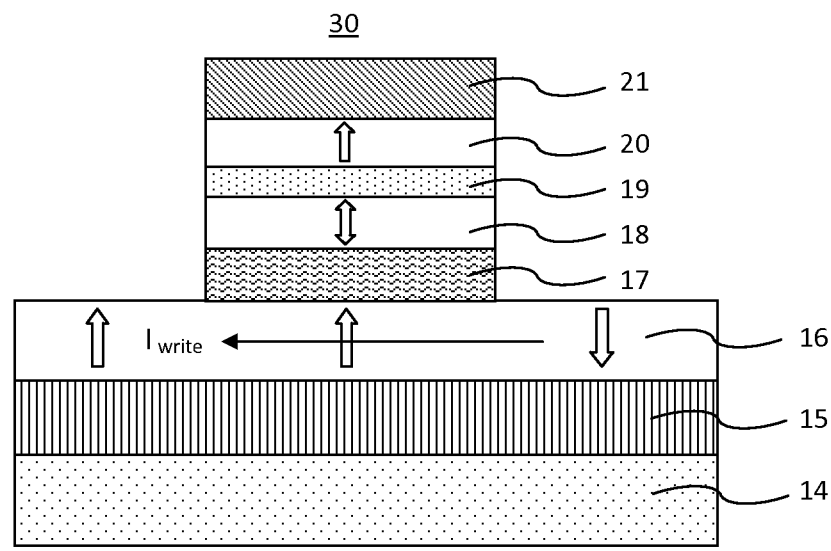
FIG. 8(A) illustrates a memory element, according to the third embodiment, having a bit "0" written in the recording layer.
Figure 8B:
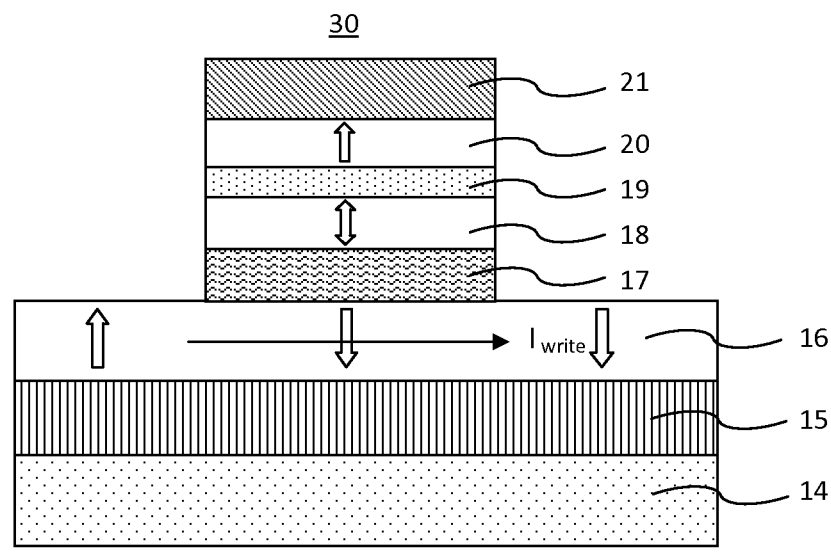
FIG. 8(B) illustrates a memory element, according to the third embodiment, having a bit "1" written in the recording layer.

FIGS. 8(A, B) show magnetoresistive element 30 illustrating the magnetization states of a recording layer in a domain wall magnetoresistive memory, respectively, according the third embodiments. In each state, the magnetization direction of the recording layer aligns along easy axis or perpendicular to the film plane, as stored data bits. As an in-plane write current flows along −x direction in the recording layer, polarized electrons flow along +x direction and drive a domain wall move across the region which is overlaid by the reference layer, a data bit "0" is recoded, as shown in FIG. 8(A). As an in-plane write current flows along +x direction in the recording layer, polarized electrons flow along −x direction and drive a domain wall move across the region which is overlaid by the reference layer, a data bit "1" is recorded, as shown in FIG. 8(B).

Figure 9A:
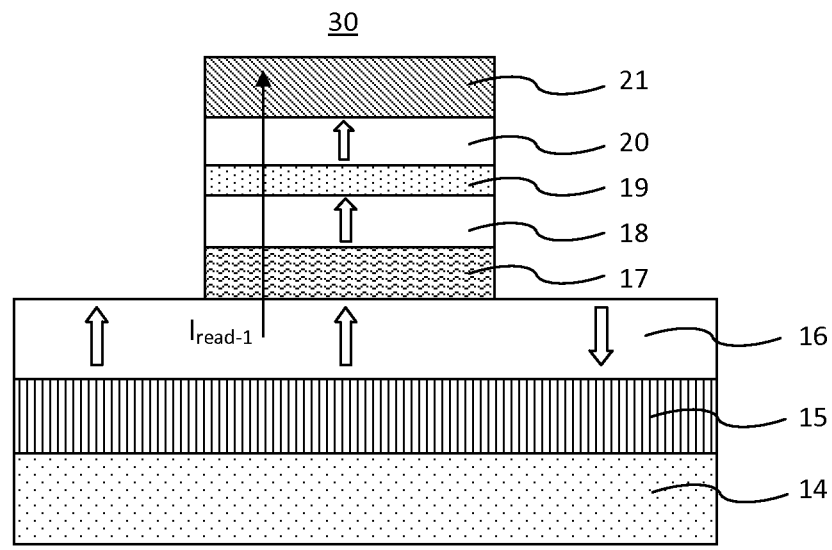
FIG. 9(A) illustrates a memory element, according to the first embodiment, having a bit "0" written in the recording layer, and having the magnetization direction in the reference layer set along +y direction to read the resistance of the magnetization state.
Figure 9B:
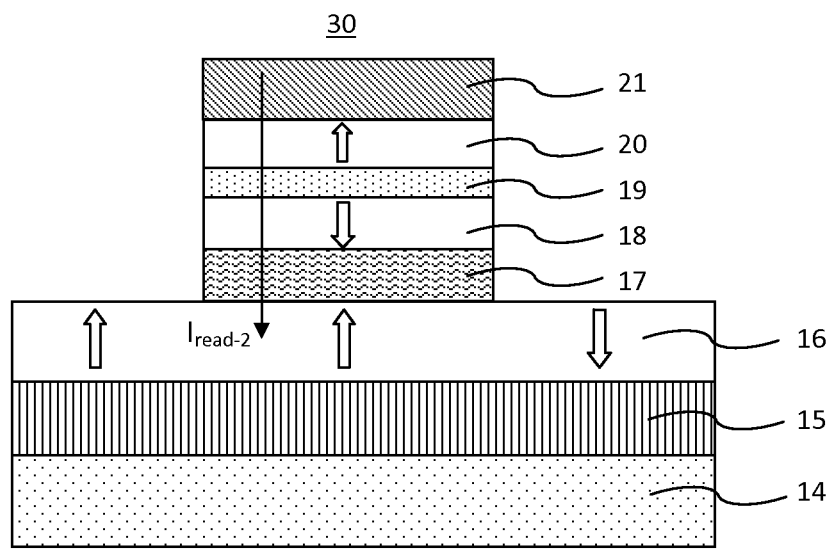
FIG. 9(B) illustrates a memory element, according to the first embodiment, having a bit "0" written in the recording layer, and having the magnetization direction in the reference layer set along −y direction to read the resistance of the opposite magnetization state.

FIGS. 9(A, B) show a self-referenced read scheme, in which the magnetization in the reference layer is first set along +y direction, as shown in FIG. 9(A), which is predominately which is predominately parallel to the easy axis of the recording layer by mean of spin transfer current from an adjacent spin-reference layer, and the first resistance is read by a circuitry, which is not shown here, is coupled to the bit line for providing a reading current between the bit line and the bottom electrode connecting to the select transistor. Then the magnetization in the reference layer is first set along −y direction, as shown in FIG. 9(B), and the second resistance is read our again and compared to the first resistance. The difference between the first and second is used to determine the magnetic state in the recording layer: a positive difference indicates a data bit "1" and a negative difference indicates a data bit "0".

Figure 10:
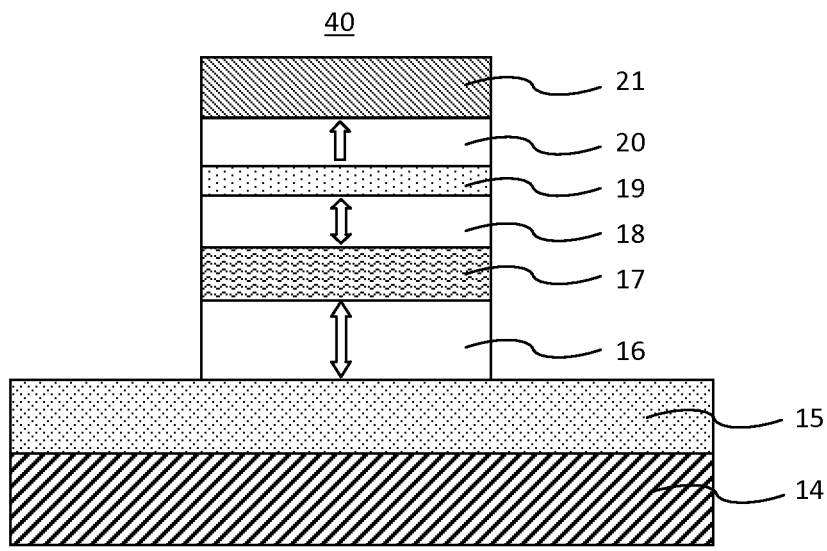
FIG. 10 is a schematic cross-sectional view of a memory element, according to the fourth embodiment.

FIG. 10 illustrates a memory element, according to the fourth embodiment, having an electric field assisted recording scheme. The perpendicular magnetoresistive element 40 comprises: a digital line 14, a dielectric functional layer 15, a perpendicular recording layer 16, a tunnel barrier layer 17, a reference layer 18, a nonmagnetic spacing layer 19, a fixed spin layer 20 and an upper electrode 21. Here, a spin-reference multilayer consists of the layer 19 and the layer 20. During a recording operation, a positive bias voltage pulse through the digital line is tuned on to generate an upward electric field on a dielectric functional layer. As a result, the perpendicular anisotropy is decreased to be smaller than a film demag field, and the magnetization in the recording layer rotates to the film plane. Then a spin transfer current is tuned on to flow across the MTJ stack, the spin transfer recording current reverses the recording layer magnetization to the direction in accordance with a direction of a current between the bit line and the select transistor. At last both the bias voltage and the spin transfer current are tuned off to finish the recording process. During a reading operation, a zero or negative bias voltage pulse through the digital line is tuned on to generate zero or a downward electric field on a dielectric functional layer. As a result, the perpendicular anisotropy is increased to make the recording layer magnetization more stable, then the reference layer is first set along +y direction, which is predominately which is predominately parallel to the easy axis of the recording layer by mean of spin transfer current from an adjacent spin-reference layer, and the first resistance is read by a circuitry, which is not shown here, is coupled to the bit line for providing a reading current between the bit line and the bottom electrode connecting to the select transistor. Then the magnetization in the reference layer is first set along −y direction, and the second resistance is read our again and compared to the first resistance. The difference between the first and second is used to determine the magnetic state in the recording layer: a positive difference indicates a data bit "1" and a negative difference indicates a data bit "0".

Figure 11:
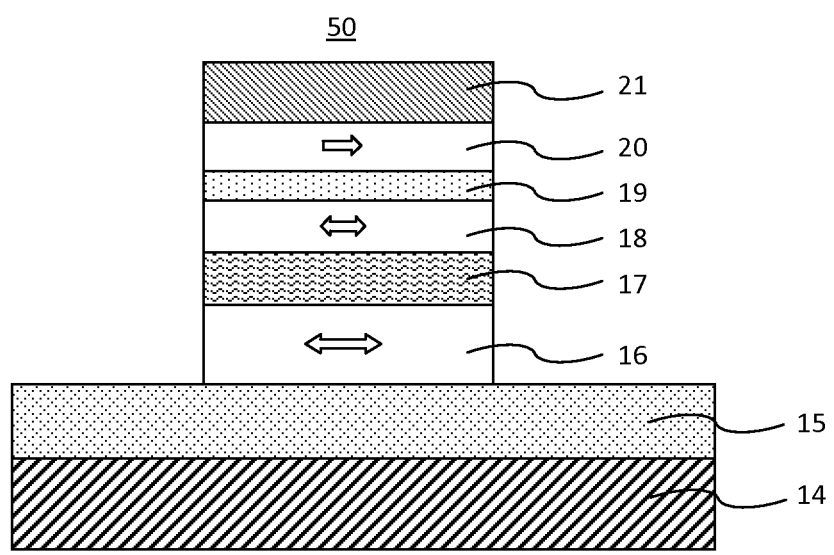
FIG. 11 is a schematic cross-sectional view of a memory element, according to the fifth embodiment.

FIG. 11 illustrates a memory element, according to the fifth embodiment, having an electric field assisted recording scheme. The planar magnetoresistive element 50 comprises: a digital line 14, a dielectric functional layer 15, a planar recording layer 16, a tunnel barrier layer 17, a reference layer 18, a nonmagnetic spacing layer 19, a fixed spin layer 20 and an upper electrode 21. Here, a spin-reference multilayer consists of the layer 19 and the layer 20. During a recording operation, a negative bias voltage pulse through the digital line is tuned on to generate a downward electric field on a dielectric functional layer. As a result, the perpendicular anisotropy is increased and the magnetization in the recording layer rotates to be perpendicular to the film plane. Then a spin transfer current is tuned on to flow across the MTJ stack, the spin transfer recording current reverses the recording layer magnetization to the direction in accordance with a direction of a current between the bit line and the select transistor. At last both the bias voltage and the spin transfer current are tuned off to finish the recording process. During a reading operation, a zero or positive bias voltage pulse through the digital line is tuned on to generate zero or an upward electric field on a dielectric functional layer. As a result, the planar anisotropy is increased to make the recording layer magnetization more stable, then the reference layer is first set along -x direction, which is predominately which is predominately parallel to the easy axis of the recording layer by mean of spin transfer current from an adjacent spin-reference layer, and the first resistance is read by a circuitry, which is not shown here, is coupled to the bit line for providing a reading current between the bit line and the bottom electrode connecting to the select transistor. Then the magnetization in the reference layer is first set along +x direction, and the second resistance is read out again and compared to the first resistance. The difference between the first and second is used to determine the magnetic state in the recording layer: a positive difference indicates a data bit "1" and a negative difference indicates a data bit "0".

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A spin-transfer torque random access magnetoresistive memory (STT-MRAM) comprising
   a. at least one memory cell, each comprising
      i. a magnetoresistive memory element comprising:
         1. a recording layer having a first magnetic anisotropy and having a switchable magnetization along anisotropy easy axis directions;
         2. a tunnel barrier layer adjacent to the recording layer;
         3. a soft reference layer adjacent to the tunnel barrier layer, having a variable magnetization direction and having a second magnetic anisotropy;
         4. an spin-reading multilayer adjacent to the soft reference layer, comprising a first nonmagnetic spacing layer and a first ferromagnetic or ferrimagnetic layer having a fixed magnetization direction; and
         5. an spin-recording multilayer adjacent to the recording layer, comprising a second nonmagnetic spacing layer and a second ferromagnetic or ferrimagnetic layer having a fixed magnetization direction;
      ii. a bit line atop the magnetoresistive memory element; and
      iii. a select CMOS transistor coupled the plurality of magnetoresistive memory elements through an electric connection under the magnetoresistive memory element;
   b. a control circuitry coupled through the bit line and the select transistor to selected ones of the plurality of magnetoresistive memory elements; and
   c. a recording capability/mechanism/method comprising a data bit is written or recorded as the recording layer magnetization direction is switched along one of anisotropy easy axis directions in the recording layer; and
   d. a self-referenced reading capability/mechanism/method comprising:
      i. having that the soft reference layer magnetization in a selected bit is rotated to be parallel to a first anisotropy easy axis direction of the recording layer so that a first magnetoresistance read signal is obtained and stored;
      ii. having that the soft reference layer magnetization in a selected bit is rotated to be parallel to a second anisotropy easy axis direction of the recording layer so that a second magnetoresistance read signal is obtained and compared to the first magnetoresistance signal; and
      iii. having that the stored data bit is determined to be a first state as the difference between the first magnetoresistance read signal and the second magnetoresistance signal is positive, and the stored data bit is determined to be a second state as the difference between the first magnetoresistance read signal and the second magnetoresistance signal is negative.

2. The element of claim 1, wherein said recording layer magnetization is switched by means of the spin-recording layer induced spin transfer torque switching, or spin transfer torque driven domain wall moving along the recording layer.

3. The element of claim 1, wherein said the soft reference layer magnetization is rotated to be parallel to each anisotropy easy axis direction of the recording layer by means of an external magnetic field, or the spin-reference layer induced spin transfer torque.

4. The element of claim 1, wherein said second magnetic anisotropy is less than one half of said first magnetic anisotropy, preferred to be less than one fifth of said first magnetic anisotropy.

5. The element of claim 1, wherein said recording layer and said reference layer have perpendicular anisotropies and a perpendicular magnetizations.

6. The element of claim 1, wherein said recording layer and said reference layer have anisotropies and magnetizations in film planes.

7. The element of claim 1, wherein said first optional nonmagnetic spacing layer and said second optional nonmagnetic spacing layer are thin layers of metal materials, preferred to be selected from Cu, Ag, Au, Ru, Rh, or their alloys.

8. The element of claim 1, wherein said first optional nonmagnetic spacing layer and said second optional nonmagnetic spacing layer are thin layers of metal oxide, metal nitride, metal oxynitride materials, preferred to be selected from MgO, MgN, MgZnO, ZnO, AlOx, AlNx, TiOx, MgTiO, or their doped materials having doping agents, preferred to be selected from Li, Cr, Ta, Ti, Ni, W, Mo, Nb, Hf, Zr, Ru, Al, Cu, Si.

9. The element of claim 1, wherein said soft reference layer is a multi-layer comprising ferromagnetic sub-layers and optional nonmagnetic insertion sub-layers containing at least one element selected from Ta, Hf, Zr, Ti, Mg, Nb, W, Mo, Ru, Al, Cu, Si and having a thickness less than 0.5 nm.

10. The element of claim 1, wherein an interface option of said soft reference layer adjacent to the tunnel barrier layer contains a damping constant enhancement doping agent, preferred to be selected from Pt, Pd, Rh, Ir, Ta, Hf, Zr.

11. The element of claim 1, wherein said recording layer is a multi-layer comprising ferromagnetic sub-layers and optional nonmagnetic insertion sub-layers containing at least one element selected from Ta, Hf, Zr, Ti, Mg, Nb, W, Mo, Ru, Al, Cu, Si and having a thickness less than 0.5 nm.

12. The element of claim 1, wherein an interface option of said recording layer adjacent to the tunnel barrier layer contains a damping constant enhancement doping agent, preferred to be selected from Pt, Pd, Rh, Ir, Ta, Hf, Zr.

13. The element of claim 1, wherein said tunnel barrier layer is made of a metal oxide or a metal nitride, a metal oxynitride, preferred to be MgO, ZnO, MgZnO, MgN, MgON.

14. The element of claim 1, wherein said recording layer further comprises two extended regions from tunnel barrier layer overlaid area and having opposite magnetization directions and electric lead contacts to conduct bi-directional current along said recording layer.

15. The element of claim 1, further comprising a dielectric functional layer immediately under the stack consisting of said recording layer, tunnel barrier layer and soft reference layer, and comprising a digital line immediately under the dielectric functional layer.

16. The element of claim 15, wherein said digital line is made of a metal layer or multilayer having a thickness more than 2 nm and less than 2 microns, preferred to have at least one element selected from Ru, Cu, Au, Ag, Al, or other high conductive metal elements.

17. The element of claim 15, wherein said digital line is made of a metal multilayer having at least one interface layer at the top surface or the bottom surface, preferred to be selected from Ta, TaN, AlN, IrN, or other nano crystal or amorphous materials.

18. The element of claim 15, wherein said recording layer is a ferromagnetic layer containing Boron, preferred to be CoFeB or CoB, FeB, the Boron composition percentage is preferred to be at least 10%.

19. The element of claim 15, wherein said dielectric functional layer is made of a metal oxide or a metal nitride, a metal oxynitride having Rocksalt crystalline structures, preferred to be MgO, ZnO, MgZnO, MgN, MgON, has a thickness more than 2 nm.

20. A spin-transfer torque magnetoresistive memory comprising
   a. at least one memory cell, each comprising
      i. a magnetoresistive memory element comprising:
         1. a recording layer having a first magnetic anisotropy and having a switchable magnetization along anisotropy easy axis directions;
         2. a tunnel barrier layer adjacent to the recording layer; and
         3. a soft reference layer adjacent to the tunnel barrier layer, having a variable magnetization direction and having a second magnetic anisotropy;
      ii. a bit line atop the magnetoresistive memory element; and
      iii. a select CMOS transistor coupled the plurality of magnetoresistive memory elements through an electric connection under the magnetoresistive memory element;
   b. a control circuitry coupled through the bit line and the select transistor to selected ones of the plurality of magnetoresistive memory elements; and
   c. a recording capability/mechanism/method comprising a data bit is written or recorded as the recording layer magnetization direction is switched along one of anisotropy easy axis directions in the recording layer; and
   d. a self-referenced reading capability/mechanism/method comprising:
      i. having that the soft reference layer magnetization in a selected bit is rotated to be parallel to a first anisotropy easy axis direction of the recording layer so that a first magnetoresistance read signal is obtained and stored;
      ii. having that the soft reference layer magnetization in a selected bit is rotated to be parallel to a second anisotropy easy axis direction of the recording layer so that a second magnetoresistance read signal is obtained and compared to the first magnetoresistance signal; and
      iii. having that the stored data bit is determined to be a first state as the difference between the first magnetoresistance read signal and the second magnetoresistance signal is positive, and the stored data bit is determined to be a second state as the difference between the first magnetoresistance read signal and the second magnetoresistance signal is negative.

* * * * *